United States Patent [19]
Wajid

[11] Patent Number: 5,233,261
[45] Date of Patent: Aug. 3, 1993

[54] BUFFERED QUARTZ CRYSTAL

[75] Inventor: Abdul Wajid, East Syracuse, N.Y.

[73] Assignee: Leybold Inficon Inc., East Syracuse, N.Y.

[21] Appl. No.: 812,685

[22] Filed: Dec. 23, 1991

[51] Int. Cl.$^5$ .............................................. H01L 41/08
[52] U.S. Cl. ................................... 310/364; 310/312
[58] Field of Search .............. 310/312, 328, 361, 364; 73/508

[56] References Cited

U.S. PATENT DOCUMENTS

| | | | |
|---|---|---|---|
| 3,528,851 | 5/1965 | Koneval | 310/320 |
| 3,891,873 | 6/1975 | Yanagisawa et al. | 310/364 |
| 4,383,194 | 5/1983 | Ohigashi et al. | 310/326 |
| 4,433,264 | 2/1984 | Nishiyama et al. | 310/364 |
| 4,692,658 | 9/1987 | Kushida et al. | 310/364 |
| 4,848,643 | 7/1989 | Frische et al. | 310/338 |

FOREIGN PATENT DOCUMENTS

| | | | |
|---|---|---|---|
| 3638286 | 5/1988 | Fed. Rep. of Germany | 310/364 |
| 0132187 | 10/1979 | Japan | 310/364 |
| 0100814 | 6/1985 | Japan | 310/364 |

OTHER PUBLICATIONS

Protective Coatings Against Corrosion in Metal Electrodes, Sep. 1972, p. 1088.
Schmid, *Moglichkeiten und Grenzen der Schwingquartz-Schichtdickenmessung*, Detoral Dissertation, Technical University of Vienna.
Wajid, *Improving the Accuracy of a Quartz Crystal Microbalance with Automatic Determination of Acoustic Impedance Ratio*, Rev. Sci. Instrum. 62(8), Aug. 1991 pp. 2026–2033.

*Primary Examiner*—Steven L. Stephan
*Assistant Examiner*—C. LaBalle
*Attorney, Agent, or Firm*—Wall and Roehrig

[57] ABSTRACT

An AT-cut quartz crystal for a quartz crystal microbalance has a buffer layer sandwiched between an adhesion layer and an electrode layer on the front or deposition side of the crystal. The buffer layer can be a zinc layer of 6000 Å sandwiched between a titanium or chromium adhesion layer of 100 to 160 Å and a gold, silver, or aluminum outer electrode layer of about 2000 Å. The zinc layer has a relatively low bulk modulus, and absorbs stress imposed by the deposited layer. The buffer layer prolongs useful crystal life, particularly when depositing dielectric materials. The crystal should have a modest surface roughness as keying-in structure.

15 Claims, 1 Drawing Sheet

BUFFERED QUARTZ CRYSTAL

BACKGROUND OF THE INVENTION

This invention relates to quartz crystal microbalances of the type used in measuring film deposition thickness and deposition rates. The invention is more particularly concerned with an improved piezoelectric crystal construction that prolongs the crystal's useful life.

Quartz crystal microbalances or quartz crystal deposition monitors are widely employed in film deposition work where the thickness and rate of deposition have to be closely monitored. The thickness shear mode resonance of an AT-cut piezoelectric quartz crystal is very useful in monitoring the rate of deposition of thin solid film on a substrate. In a typical arrangement, a sensor quartz crystal with appropriate electrodes is placed in the deposition chamber next to the substrate to be coated and is exposed to the material vapors. The materials condense on the face of the crystal at a rate that can be easily monitored with a suitable oscillator driver circuit. There is a direct proportion relationship between the amount of material deposited on the face of the quartz crystal and that deposited on the substrate. This proportionality constant, called the tooling factor, depends on the physical locations of the crystal and the substrate with respect to the source. Thus, the amount of foreign mass deposited on the substrate can be deduced from changes in the resonant frequency of the crystal. This is the essence of the working of a quartz crystal microbalance (QCM) instrument.

There are a number of methodologies available for interpreting the frequency-shift to mass-deposit relation. Most recently, QCM instruments have relied on the well-known Lu-Lewis formulation or on a so-called Z-match technique. These techniques have improved the sensitivity of measurement, to the limit of the ability of the crystal to receive continued deposition without resonance failure.

Some important applications QCM instruments involve vacuum deposition of metals and dielectrics by physical vapor deposition or sputtering methods in the semiconductor and the optical coating industry. To a lesser extent, these devices are also used in MBE, CVD and electroless plating operations.

AT-cut quartz crystals are the primary choice as sensor crystals for QCM instruments. This particular cut of crystal has the merit of superior mass sensitivity, significantly reduced temperature coefficient and relatively low manufacturing cost. For this type of crystal, the dominant mode of vibration is thickness shear, although some degrees of thickness twist is also present. Thus, various combinations of thickness shear and twist motion give rise to numerous resonances. The lowest frequency resonant mode is called the fundamental mode and is of primary importance in the context of the QCM instruments. Anharmonics and quasiharmonics may also be of interest, but these accompany the fundamental in a predictable manner.

Sensor crystals tend to be discs or discoids, although other shapes are also possible. Typical diameters of the sensor crystals range between 0.5 to 1.0 inch. For performance related reasons, there are restrictions on the diameter-to-thickness ratio of the crystal blanks, particularly for the plano-plano crystals. Such crystals have their principal surfaces plane and a parallel to each other. However, the majority of sensor crystals belong to a category called plano-convex. Such crystals have one of the principal surfaces rendered convex. The process is called contouring and it results in superior performance due to an effect called energy trapping (confinement of vibrational energy in the central region).

In order to excite and detect resonance vibrations in a piezoelectric quartz crystal, appropriate electrodes must be placed on its surfaces. Typically, one face of the crystal is completely coated with a chosen electrode material. On the other face (usually the contoured one) a smaller electrode is placed, just large enough to cover the active area.

The electrode material is usually metallic, such as aluminum, silver or gold. Generally, electrode thicknesses are 2,000-5,000 Å. If gold or silver is used, an underlayer of titanium or chromium (50-300 Å) is also applied prior to electrode placement, in order to increase the electrode adhesion to the quartz plate. Generally, aluminum and silver coated crystals have shorter shelf life, possibly due to surface oxidation or sulphur contamination.

The sensor crystals to be used with QCM instruments have a limited lifetime. That is, the crystals are effective only for a limited thickness of material deposited thereon. As material is deposited upon a crystal, its quality (resonator Q-factor) progressively degrades. When it deteriorates to such a point that the resonance is no longer well defined, then the driving/detecting circuitry fails to detect the desired resonance. At that point, the crystal is no longer useable. At what stage a crystal will fail depends on many factors, such as the initial quality of the sensor crystal (measured in terms of its starting motional resistance), the characteristics of the deposition material, the rate of deposition, ambient temperature, etc. In general, in high temperatures and at high deposition rates, the crystal is likely to fail earlier for a given material. There is a dramatic difference in resonance sharpness for the fundamental mode resonance of an uncoated and a coated crystal.

For a typical 6 Mhz sensor crystal, the useful life could be more than 2 Mhz of frequency shift for materials like copper. In such materials, the failure occurs due to internal friction (viscous damping) in the thick film of the deposited material. For materials like nickel, the life could be less than 0.7 Mhz of frequency shift, even at low deposition rates. Here, the failure mechanism is different. Because nickel film has high intrinsic stress, it literally tears itself apart when it grows to a sufficient thickness, taking part of the quartz with it. When two dissimilar metals are deposited in alternate order (e.g., in optical coatings or engineered band structures), lattice mismatch and differences in thermal expansion coefficients rapidly increase stress in the interface, eventually causing total loss of resonance.

One of the important applications of QCM instruments is in optical coatings. Various dielectric materials, such as magnesium fluoride, silicon dioxide, titanium dioxide and cryolite are deposited on lenses, mirrors and eyeglasses. The aim is to fabricate optical bandpass filters and anti-reflection coatings over some wavelength spectrum of interest. These coatings are deposited at very low and precise rates to control the optical characteristics of the final product. In the semiconductor industry, insulating silicon dioxide and other dielectrics are often deposited on silicon substrates as diffusion barriers, although precise rate may be less critical.

The quartz crystal microbalance is the only practical means for in situ monitoring and control of the growth rate of such optical/dielectric films. Other methods, such as optical interferometry and ellipsometry, are cumbersome and expensive. Low energy electron impact induced emission spectroscopy (EIES), though highly successful in metal depositions, is insensitive to dielectric materials.

It commonly occurs that when a quartz crystal is used for monitoring the deposition of dielectric material, the useful crystal life is drastically shorter than for the same crystal to monitor the deposition of metals. Some materials, like magnesium fluoride and zirconium dioxide, brutally shorten crystal life. For such materials, the crystal ceases to operate at only about 0.30 Mhz of frequency shift into the process. To make matters worse, crystal failure occurs rather suddenly, and the resonator Q-factor rapidly deteriorates. For many applications, this is a serious hindrance. One way to overcome this handicap is by having a reserve of multiple crystals within the vacuum chamber. But even then the operator must detect the advent of an imminent crystal failure and promptly switch over to a new crystal, if available. Otherwise the process will suffer. In contrast, metal deposition degrades crystal quality rather progressively, giving forewarning to change the crystal in order to save the work in process.

Two major factors contribute to the early demise of sensor crystals in the dielectric depositions. First, an excessively smooth surface of a high-Q quartz resonator lacks sufficient keying in points. That is, a highly polished crystal lacks surface roughness, which does not help the cause of adhesion of the deposited film. Sometimes, when deposition is at a high rate, the film simply peels off from the surface of a crystal due to this smoothness coupled with built up stress in the deposited film. This phenomenon is known as "snowing" because of the appearance of small flakes on the electrode surface.

Second, and more importantly, dielectric films generate high interfacial stress but have little mechanical strength. It is observed that, when the deposited film's thickness becomes appreciable, the quartz crystal's Q-factor dramatically diminishes and it is no longer useful as a mass sensing mechanism. In the deposition monitor instruments, the familiar signature of this failure is a rapid increase in the apparent or measured deposition rate (or decrease of frequency) followed by loss of resonance within a very short period of time.

Thus, the superficial symptoms of crystal failure in the optical coating processes appear to be different. When a crystal with dielectric coating is examined under a metallurgical microscope, the grains on the surface have a non-uniform appearance. This suggests the growth to be columnar in nature. The low adhesion of some dielectric films to the gold or silver electrodes further complicates this problem and further hastens failure.

It is believed, at least by the inventor here, that crystal failures in the depositions of dielectric films are due to stress distortion in the deposited layer. In the case of one particular failed crystal with a silicon dioxide deposit on it, it was found that the surface has broken at random into many small but distinctly continuous pieces. The situation is similar to the breakage of a thin sheet of ice on a frozen pavement, when one walks over it. When stress (intrinsic and/or thermal) in the film became excessive, it attempted to distort the quartz crystal to relieve stress. The crystalline quartz blank, being much thicker and stronger, resisted distortion. As a result, the film itself crumbled under the dint of its own stress.

As mentioned before, the acoustic loss mechanism in most metals is due to internal friction, that is, due to viscous losses within the bulk of the material. In such case, the equation of wave propagation involves one damping parameter, $\alpha$, as embodied in the equation $$A(x) = A_0 \cos(kx - wt) \exp(-\alpha x).$$

Here, $A(x)$ is the amplitude of wave at some distance, $x$, along the propagation direction from a point where the amplitude is $A_0$. The parameters $k$ and $w$ represent wave number and angular frequency, respectively. The attenuation coefficient, $\alpha$, remains relatively unchanged. Therefore, the longer the acoustic path (i.e. thicker the deposited film), the more the acoustic energy loss (proportional to the square of amplitude). This conforms to the general observation of the slow degradation of crystal resonances in metal depositions. In contrast, the acoustic loss mechanism in the optical/dielectric films is largely due to surface scattering.

In a quartz crystal or any other similar mechanical resonator, the phenomenon of resonance exists because of constructive interference of the reflected waves from the two principal surfaces. This is possible because both of the reflected wave fronts are coherent, as the reflecting surfaces are generally smooth and continuous. On the other hand, if one of the surfaces is very rough or discontinuous, the reflected wavefront is incoherent, because different parts of the wavefront undergo different amount of phase shifts. When such reflected waves interfere with each other, the general result is the loss of resonance. Observed rapid failures in the case of dielectric coatings support this theory.

OBJECTS AND SUMMARY OF THE INVENTION

It is a prime object to provide a piezoelectric crystal resonator with a mechanism to reduce crystal failure, especially when monitoring deposition of dielectric films.

It is another object to provide a crystal resonator with a mechanism to absorb or relieve the stress at the quartz-film interface.

As indicated earlier, we have observed that the stressed state of dielectric films is inherently unstable, and that its effort to relieve stress by deforming the non-compliant crystal substrate have resulted in shattering of the dielectric film deposit, as its mechanical strength is comparatively low.

Therefore, in keeping with an aspect of this invention, a layer of suitable compliant material is sandwiched between the crystal substrate and the outer electrode layer, which gives the crystal surface an effective bulk modulus much lower than that of the deposited film. This buffer layer beneath the electrode provides a stress relief mechanism but does not impair the adhesion of the film layer onto the crystal resonator. Therefore, with this crystal structure, the deposited film layer can accumulate without its film stress rising to a level that would lead to crumbling or shattering. Thus, this mode of failure is avoided, and the crystals experience much longer life.

To achieve suitable "keying in" of the deposited materials, the crystal layer should have at least a predetermined roughness, and not be overly polished. As an approximate guideline, the mean absolute deviation from a true flat surface should be about 15 microinches to about 25 microinches. The adhesive layer, buffer layer, and outer electrode layer will then have about the same roughness characteristics.

The front or exposed side of the crystal is formed by depositing an adhesion layer, e.g. Ti or Cr, and then a layer of a suitable compliant material, with the gold, silver or aluminum electrode layer being deposited on the buffer layer. In some cases it may be possible to eliminate the adhesion layer if the compliant buffer material forms a strong bond with the piezoelectric crystal layer. In other cases, where the buffer layer is suitably conductive and does not react with the deposited material, it may be possible to omit a discrete electrode overlayer.

The material for this buffer layer ought to have the following desirable characteristics:

1. It should have low Young's modulus/bulk modulus to absorb interface strain;
2. It should have good adhesion to gold/silver;
3. It should have decent electrical conductivity;
4. It should not exhibit excessive acoustic damping;
5. It should have good thermal conductivity;
6. It should be compatible with quartz regarding acoustic impedance;
7. Preferably, it should have minimal handling risk;
8. It should not degrade shelf life of the finished crystal, i.e. it should have a low solubility in the gold/silver electrode layer.

It if is not possible to satisfy all of these requisites with a single material, then compromises have to be made to achieve the best performance with minimal complexity in fabrication.

The following materials stand out as potential candidates for the buffer layer. These are aluminum, bismuth, cadmium, calcium, indium, lead, selenium, silver, tellurium, tin and zinc. A suitable alloy with the desirable characteristics could be employed. Preliminary testing with cadmium, lead, copper and calcium showed very good results, while aluminum and indium showed modest improvement in crystal life.

However, we found that zinc buffered crystals offered the best overall performance. Zinc has a nominal density of 7.04 g/cc, z-ratio of 0.51, electrical resistivity of $5.92 \times 10^{-6}$ ohm-cm and bulk modulus of $0.598 \times 10^{11}$ N/m$^2$. Zinc is known to form hexagonal close pack (hcp) structure with 2.66 Å and 4.95 Å lattice constants. From the materials handling perspective, zinc is considered to be quite benign. Zinc oxide is also harmless, being used in baby powders and calamine lotions.

The above and many other objects, features, and advantages of this invention will present themselves from the ensuing description of a preferred embodiment, when considered in connection with the accompanying Drawing.

DETAILED DESCRIPTION OF THE PREFERRED EMBODIMENT

Figure 1:
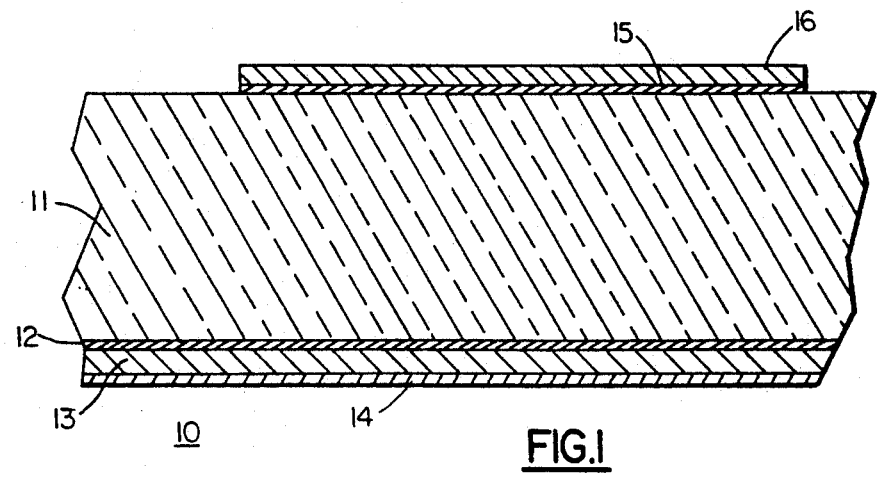
FIG. 1 is a schematic view of a crystal resonator showing the buffer layer.

With reference initially to FIG. 1, a piezoelectric crystal resonator 10 is formed with a quartz blank 11. The blank 11 should be suitably cleaned according to conventional procedures. This is an AT-cut disc, which can be plano-plano, bevelled plano-plano, or plano-convex. Here the crystal is oriented downwards, i.e. with the front side down in the Drawing. Preferably, a plano side of the blank 11 serves as the front. On this side an adhesion layer 12 of titanium or chromium is deposited to a thickness of about 100 Å. Then a buffer layer 13 of zinc is deposited to a thickness of about 6000 Å. This serves as a compliant, stress absorbing means. An outer electrode layer 14 of silver is deposited to a thickness of about 2000 Å. On the back side, i.e., convex side of the crystal blank 11 an adhesive layer 15 of titanium or chromium is deposited to a thickness of about 100 Å, and then a back electrode layer 16 of silver of about 2500 Å is laid down, using a conventional electrode pattern mask. These layer thicknesses are not considered critical, and a wide range of thickness for each layer is possible. This does present a successful example, however.

The following experimental data are provided to show the advantages achieved by this invention.

A batch of nine zinc buffered crystals was checked on an HP impedance analyzer. The fundamental resonance frequency of the sample was found at $5,969.7 \pm 8.3$ kHz and resistance $9.9 \pm 0.6$ Ω.

Adhesion was tested by depositing nickel film on zinc buffered crystals. The strength of the bond appears to be adequate. The nickel film peeled off the quartz at around 150 kÅ of film deposition. Conventional gold electrode crystals, coated side-by-side, lasted to about 200 kÅ.

The buffer layer does not appear to have an adverse effect on the accuracy of predicted rate and thicknesses. In a test, the layer thicknesses calculated from the frequency shifts were compared with gravimetrically measured thickness. The procedure followed is well known and documented, and has been detailed elsewhere. The deposition materials used for the tests were magnesium fluoride, zirconium dioxide, cryolite and silicon dioxide.

The results achieved with magnesium fluoride deposition are excellent. The buffered crystal lasted as long as six regular gold coated crystals. The accuracy is very good, and comparable to metal depositions. The mean absolute error per layer was 1.36%, using the Auto-Z technique, which is described in co-pending U.S. Pat. application Ser. No. 505,668 filed Mar. 30, 1990. It was determined that the maximum error in gravimetrically measured thickness is less than 1%.

Figure 2A:
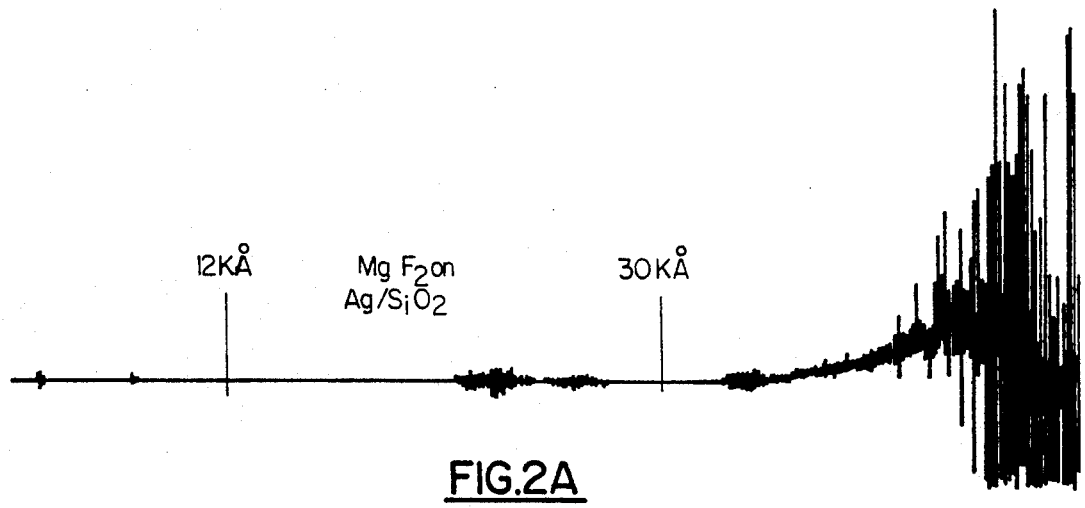
FIGS. 2A and 2B are QCM rate traces showing behavior of a conventional crystal and a crystal of this invention, under depositions of magnesium fluoride.
Figure 2B:
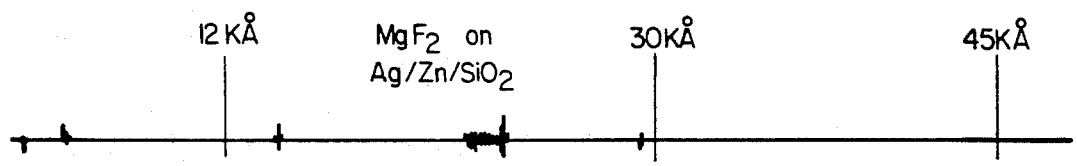

FIGS. 2A and 2B show the performance characteristics of these crystal oscillators where the deposition of magnesium fluoride is monitored. Deposition rate (based on rate of change of the fundamental resonance) appears on the ordinate, while coating thickness increases from left to right on the abscissa. FIG. 2A traces the behavior of a conventional AT quartz crystal. There is a rapid increase of apparent rate at about 40 KÅ of MgF$_2$, followed by catastrophic failure, which appears here as a rapidly fluctuating rate variation.

On the other hand, the behavior of a buffered crystal oscillator, monitoring the same deposition of MgF$_2$, is shown in FIG. 2B. Here the monitored rate appears constant and actually continues for as much coating as consumed five to six of the conventional crystals. The fluctuation at about 24 KÅ is an artifact and appears similarly on both crystals.

With cryolite, a buffered crystal lasted through 2.5 conventional crystals. The accuracy was again excellent. The mean absolute error per layer was 0.79%, using the Auto-Z technique.

With zirconium dioxide, one buffered crystal lasted through 5.5 regular crystals, and the mean absolute layer error was 2.47%. Similarly, with silicon dioxide, one buffered crystal lasted as long as three regular crystals. The error in this case was 3.88%. Somewhat higher error with oxide materials is not surprising. Under the impact of electron beam in the e-beam gun, most of the oxide materials undergo partial dissociation, as is evidenced by increase in the deposition chamber pressure. It is a general observation that, in the presence of gases (as in reactive PVD or sputtering processes), the film deposition on the quartz crystal is spatially non-uniform. This is the primary cause of layer error. This is seen in all crystals, buffered and conventional alike.

The shelf life of zinc buffered silver crystals appear to be similar to that of the conventional silver coated quartz crystals. No significant drastic color variation of the buffered crystals appeared over a period of a month.

This improvement to the fabrication of electrodes for AT-cut quartz crystals, including a compliant buffer layer between quartz plate and top electrode layer, provides for a mechanism of interfacial stress relief.

As a result of such a buffer layer, the resonator quality (Q-factor) of the quartz crystal remains unaffected for a significantly longer time than a quartz crystal with conventional electrodes under identical and extremely stressful environmental conditions.

Stressed environments, where this crystal resonator is advantageous, can include, among others, physical vapor deposition and sputter deposition of optical and dielectric films on various substances, where crystals are employed as sensors for QCM instruments.

The buffer layer can be formed of other compliant materials, such as lead, cadmium, copper and aluminum. Also, the layer thicknesses can be varied, as need be, to be effective in various environments.

For the same reasons, this invention may benefit other piezoelectric resonators, besides AT-cut quartz crystals, exposed to similarly harsh environments.

A 6 MHz crystal is employed in the foregoing example, but the techniques of this invention would also benefit 4 MHz and 5 MHz crystals.

While this invention has been described in detail with reference to a preferred embodiment, it should be recognized that the invention is not limited to that embodiment. Rather, many modifications and variations will present themselves without departing from the scope and spirit of this invention, as defined in the appended claims.

What is claimed is:

1. A piezoelectric crystal for measurement of the deposition of a film of material, including a crystal layer having front and back surfaces, a back electrode deposited on the back surface of the crystal layer, and a front metallic electrode deposited on the front surface of the crystal layer and upon which said film of material accumulates during a deposition process to change the natural oscillation frequency of the crystal, wherein said front electrode includes an adhesion layer deposited against the front surface of the crystal layer, a compliant buffer layer deposited on the adhesion layer, and a conductive metallic electrode layer formed of gold or silver deposited on the buffer layer; said buffer layer being formed of an element having the following properties:

a suitably low bulk modulus and a suitably low Young's modulus; the layer being of a suitable thickness to absorb strain between the electrode layer and the film of material being deposited thereon;

a good adhesion for the gold or silver of the conductive electrode layer;

a suitably high thermal conductivity; and a low acoustic damping characteristic to avoid undue damping of vibrations in the crystal;

so as to prevent interfacial stresses during the deposition process from causing early catastrophic crystal failure, and thus to prolong the useful life of the piezoelectric crystal when used as a crystal microbalance in a film deposition process.

2. A piezoelectric crystal for measurement of the deposition of a film of material including a crystal layer having front and back surfaces, a back electrode deposited on the back surface of the crystal layer, and a front metallic electrode deposited on the front surface of the crystal layer and upon which said film of material accumulates during a deposition process to change the natural oscillation frequency of the crystal, wherein said front electrode includes an adhesion layer deposited against the front surface of the crystal layer, a compliant buffer layer deposited on the adhesion layer, and a conductive metallic electrode layer deposited on the buffer layer; said buffer layer having a suitably low bulk modulus and being of suitable thickness to absorb strain between the electrode layer and the film of material deposited thereon without undue acoustical damping of vibrations in the crystal, so as to prevent interfacial stresses during the deposition process from causing early catastrophic crystal failure, and thus to prolong the useful life of the piezoelectric crystal when used as a crystal microbalance in a film deposition process; wherein said buffer layer is selected from the group consisting of aluminum, bismuth, calcium, indium, lead, selenium, silver, tellurium, tin, cadmium and zinc.

3. The piezoelectric crystal of claim 2, wherein said buffer layer is selected from the group consisting of zinc, cadmium, lead, copper, calcium and alloys thereof.

4. The piezoelectric crystal of claim 2 wherein said buffer layer is zinc.

5. The piezoelectric crystal of claim 2 wherein said adhesion layer is selected from the group consisting of titanium and chromium.

6. The piezoelectric crystal of claim 2 wherein said adhesion layer is a deposit of titanium or chromium about 100 to 160 Å thick; said buffer layer is a deposit of zinc about 6000 Å thick; and said electrode layer is a deposit of silver about 2000 Å thick.

7. The piezoelectric crystal of claim 2 wherein said crystal layer is an AT-cut quartz crystal.

8. The piezoelectric crystal of claim 7 wherein said crystal layer front surface has a suitable surface roughness with a mean deviation from true flatness of between about 15 to 25 microinches.

9. The piezoelectric crystal of claim 2 wherein said crystal natural oscillation frequency is from about four to about six megahertz.

10. A piezoelectric crystal for measurement of the deposition of a film of material, comprising a crystal layer of a piezoelectric crystal material having a front surface and a back surface, a back electrode deposited on the back surface of the crystal layer and a front metallic electrode including a layer of gold or silver deposited on the front surface of the crystal layer and upon which said film of material accumulates during a deposition process to change the natural oscillation frequency of the crystal, wherein said front surface of the crystal layer is provided with a surface roughness characterized by a mean deviation from true flatness on the order of about 15 to 25 microinches, and said front electrode includes a buffer layer of a conductive metallic material having the following properties:
- a suitably low bulk modulus and a suitable Young's modulus; said buffer layer being
- of sufficient thickness so that the buffer layer absorbs strain between the metallic electrode and the film of material being deposited thereon;
- a good adhesion for the gold or silver of the conductive electrode layer;
- a suitably high thermal conductivity; and
- a low acoustic damping characteristic to prevent undue damping of vibrations in the crystal;

so as to prevent interfacial stresses during the deposition process from causing early catastrophic failure, and thus to prolong the useful life of the piezoelectric crystal when used as a crystal microbalance in a film deposition process.

11. A piezoelectric crystal for measurement of the deposition of a film of material, comprising a crystal layer of a piezoelectric crystal material having a front surface and a back surface, a back electrode deposited on the back surface of the crystal layer and a front metallic electrode deposited on the front surface of the crystal layer and upon which said film of material accumulates during a deposition process to change the natural oscillation frequency of the crystal, wherein said front surface of the crystal layer is provided with a surface roughness characterized by a mean deviation front true flatness on the order of about 15 to 25 microinches, and said front electrode includes a buffer layer of a conductive metallic material of suitably low bulk modulus and of sufficient thickness so that the buffer layer absorbs strain between the electrode and the film of material deposited thereon without undue damping of vibrations in the crystal, so as to prevent interfacial stresses during the deposition process from causing early catastrophic crystal failure, and thus to prolong the useful life of the piezoelectric crystal when used as a crystal microbalance in a film deposition process; wherein said buffer layer is selected from the group consisting of aluminum, bismuth, calcium, indium, lead, selenium, silver, tellurium, tin, cadmium and zinc.

12. The piezoelectric crystal of claim 11, wherein said buffer layer is selected from the group consisting of zinc, cadmium, lead, copper, calcium, and alloys thereof.

13. The piezoelectric crystal of claim 11 wherein said buffer layer is zinc.

14. The piezoelectric crystal of claim 11 wherein said front electrode includes a thin adhesive layer of titanium or chromium bonding said buffer layer to said crystal layer.

15. The piezoelectric crystal of claim 11, wherein said front electrode includes an overlayer of gold, silver, or aluminum.

* * * * *